United States Patent [19]

Chu

[11] Patent Number: 4,996,579
[45] Date of Patent: Feb. 26, 1991

[54] DESIGN FOR ELECTRONIC SPECTRALLY TUNABLE INFARED DETECTOR

[75] Inventor: Tak-Kin Chu, Bethesda, Md.

[73] Assignee: The United States of America as represented by the Secretary of the Navy, Washington, D.C.

[21] Appl. No.: 464,100

[22] Filed: Feb. 4, 1983

[51] Int. Cl.$^5$ .................. H01L 27/14; H01L 31/00
[52] U.S. Cl. ...................................................... 357/30
[58] Field of Search .................. 357/30; 250/226, 434, 250/435

[56] References Cited

U.S. PATENT DOCUMENTS

| | | | |
|---|---|---|---|
| 3,761,718 | 9/1973 | Kohn et al. | 357/30 |
| 4,131,793 | 12/1978 | Stoutmeyer et al. | 357/30 |
| 4,231,053 | 10/1980 | Schoolar | 357/30 |

Primary Examiner—Theodore M. Blum
Attorney, Agent, or Firm—Kenneth E. Walden

[57] ABSTRACT

A single element infrared detector consisting of multiple layers of successive epilayers of lead chalcogenides or their alloys with tin or cadmium to form two or more adjacent contiguous surfaces whereupon each surface is deposited with an ohmic contact. The multiple adjacent semiconductor surfaces are also each fitted or equipped with an non-ohmic contact that yields novel applications in terms of broad band and narrow scanning, particular when the epilayers are geometrically arranged to selectively allow the transmission of radiation to yield both broad band and narrow band responses concurrently so as to obtain a separate electrical signal from each adjacent contiguous semiconducting epilayer surface.

3 Claims, 4 Drawing Sheets

RELATIVE RESPONSE OF A MULTILAYER INFRARED DETECTOR AT ROOM TEMPERTURE

DESIGN FOR ELECTRONIC SPECTRALLY TUNABLE INFARED DETECTOR

BACKGROUND OF THE INVENTION

The feasibility of multi-color self filtering, infrared detectors based on epitaxial lead salt thin film technology has been demonstrated in the prior art. The multi-color response capable of detecting infrared radiation at certain selective wave bands is made possible by the growth of successive epilayers of lead chalcogenide or its alloys with tin or cadmium on a single barium fluoride substrate. Each layer gives photoresponse to infrared radiation of wave lengths or the corresponding frequencies, characteristic of the layer chemical composition, while also serving as a photon filter for the succeeding layers i.e. each semiconductor layer is used as a detection layer and as a filter layer. Since the wave band if each layer is determined by the chemical composition of the layer, it can therefore be "tuned" to some predetermined interval. The spectral range of wave lengths from 2 to 15 microns can thus be covered in this invention.

In the prior art incorporation of this multi-color detector technology the multilayers are grown successively each succeeding layer on top of the previous layer. Non-ohmic contacts and ohmic contacts are deposited on the top of the single exposed surface of each of the semiconductor layers. Typical and illustrative of this technology is the U.S. Patent to Campbell 4,323,911. In this patent a number of epilayers of semiconductor materials are successively coated one on another with the top layer being fitted with an ohmic contact and a non-ohmic contact.

It is well established in the prior art that single crystal films of lead selenide (PbSe), lead sulfide (PbS) and related compounds hereinafter referred to as lead salt alloys can be expitaxially grown on heated alkali halide substrates by vacuum evaporation.

The state of the art progressed as taught in U.S. Pat. No. 154,631 entitled "Equilibrium Growth Technique For Preparing $PbS_xSe_{1-x}$, Epilayers", filed in May 1977 by R. B. Schoolar. This patent disclosed and claimed a novel process wherein a single lead sulfide selenide epilayer, having predetermined electrical and optical properties was prepared by an equilibrium growth technique (EGT).

An alkali halide substrate maintained in near thermodynamic equilibrium with source charges is exposed to the single chimney orifice of a two zone dual chamber furnace in which a homogeneous vapor has been produced by sublimation of a lead chalcogenide alloy in one chamber and measured amounts of chalcogen in an adjacent chamber.

In a subsequent progression in the prior art, as disclosed and claimed in U.S. Pat. No. 4,282,045 to Schoolar et al. a modification of the equilibrium growth technique (EGT) was disclosed and claimed. In this patent the step of varying the alloy composition of a lead chalcogenide layer during its growth by changing the temperature of the heated substrate was a step forward in the art.

Another U.S. Pat. No. 4,282,045 issued to Dr. James D. Jensen and Richard Schoolar disclosed a variable temperature method for the preparation of multiple epitaxial layers of certain lead chalcogenide alloys wherein during preparation the temperature of the substrate was varied, providing a epilayer with graded composition and predetermined electrical and optical properties along the direction of growth. This growth technique was used to produce infrared lenses, narrow band detectors and double heterojunction lasers. In all of these prior art patents and processes known to the applicant, only one epitaxial layer was considered to be the top layer or upper layer and such layer was fitted and equipped with one non-ohmic contact, or the filter layer itself is made up of a multiplicity of semiconductor material layers, thereby limiting the spectral response capabilities of an infrared detector.

SUMMARY OF THE INVENTION

The present invention is a single element infrared detector that facilitates broad responses, as well as narrow band responses at preselected wave bands. In this single element detector, a substrate is coated in successive steps with multiple - layers of separate and distinct semiconductors materials. Each layer is comprised of two portions: an upper and lower portion, and each layer is deposited in a geometric arrangement such that each lower portion is in direct contact with the substrate and each upper portion covers a part of the lower portion or the lower portions of one or more epilayers previously deposited, and that the lower portions are adjacent and contiguous to each other, and the upper portions are also adjacent and contiguous to each other. Each upper portions is fitted with one ohmic contact and one non-ohmic contact. Thereby each upper portion of a semiconductor layer is used as a detector layer and each lower portion is used as a filter layer for the next successive detection layer of a different semiconductor material. A requirement for material selection is that the semiconductor material deposited in an earlier step be responsive to radiation of wavelengths shorter than the wavelengths of the radiation to which semiconductor material deposited in a later step is responsive, or equivalently the cutoff wavelength of a latter layer should be longer that the cutoff wavelength of an earlier layer.

A common practice method of producing the single element detector with multiple layer structure is by vacuum depositing the layers, where a heated substrate is placed directly over the outlet of an oven container, the semiconductor source material, and the multilayers can be deposited successively by either moving the substrate over a multiple oven arrangement, or by changing the semiconductor source in the oven. Delineation of the geometric pattern of each of the multiple semiconductor layers can be achieved simple by contact masks, even though other methods such as photo-lithographic techniques are also applicable. The thickness of each layer should be of such magnitude so that it is smaller than the minority carrier diffusion length of the semiconductor material but greater than the characteristic absorption length of the radiation to which the semiconductor is sensitive. For the semiconductor materials commonly used for infrared detector this thickness is usually on the order of a few microns.

When two different material, e.g. PbS and PbSe are deposited on the substrate, one of these same materials i.e. PbSe may extend and overlap, to become the upper portion or the detection layer as shown in the drawings. In an alternative method an entirely different material e.g. $Pb\ S_{0.5}Se_{0.5}$ may be deposited to form the detection layer.

This multi-layer technique allows the operational integration of all the narrow band elements each consisting of a single semiconductor material into a single broad band detector while the narrow band characteristics of each are still being maintained. This integration which can simply be achieved by the summation of the electrical signal outputs from the individual elements can be done electrically by circuitry external to the detector itself. The circuitry should also provide selection of the individual outputs and/or of their combinations.

Accordingly, one object of the invention is to provide an infrared detector comprising epilayers that selectively allow transmission of radiation of certain wavelengths that are dependent and directly calculatable from the chemical composition of each of the said epilayers.

It is another important object of this invention to provide an infrared detector that because of its geometric configuration of epilayers together with multiple non-ohmic contacts allows wide selection of operation modes on a single element detector.

It is still a further object of this invention to provide an infrared detector that has mode selection that can be accomplished electronically that eliminates the use of auxiliary optical systems such as band-pass filters or beam splitters.

Another object of the invention is to provide a multiple layer for the sensitive materials wherein each of the upper portions of the layers the detection layers is coated with at least one non-ohmic contact and each said portion also is in contact with one ohmic contact.

Still another object of the invention is to provide both ohmic and non-ohmic contacts in a circuit with a voltage measuring electrical device to allow monitoring of radiation as indicated by a voltage measured in a completed circuit.

BRIEF DESCRIPTION OF THE DRAWINGS

A more complete appreciation of this invention and many of the attendant advantages thereof will be readily appreciated as the same becomes better understood by reference to the following detailed description when considered in conjunction with the accompanying drawings in which like numbers indicate the same or similar components, wherein.

DETAILED DESCRIPTION OF THE INVENTION

Figure 1:
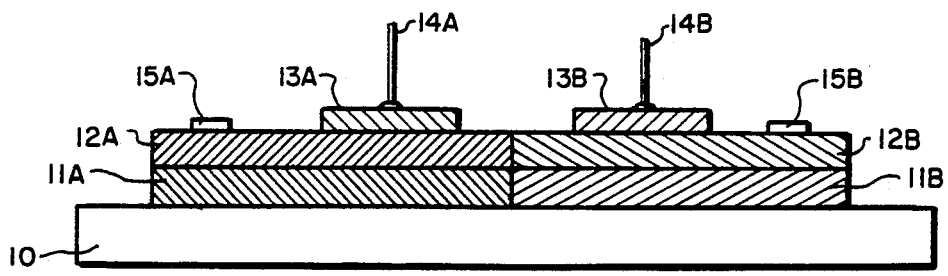
FIG. 1 is an isometric or perspective view of multilayer detector illustrating the prior art.

Referring now to the drawings, and in particular to FIG. 1, there is shown a perspective or isometric view of a single element infrared detector comprising a base or base substrate 10 with a succeeding semiconductor layer made of two materials 11A and 11B respectively, and a second semiconductor layer 12 comprising one material 12A and a separate and distinct material 12B. In this figure it is pointed out and illustrated that the detection layer 12 made of two distinct different materials 12A and 12B defines two optical areas having different optical properties and absorption properties because of a difference in chemical composition. Accordingly, optical area 12A is fitted with a non-ohmic contact 13A and a lead wire 14A. The adjacent contiguous detection layer 12B is also coated with a non-ohmic contact 13B and a lead wire 14B. Each optical surface 12A and 12B should also be equipped with an ohmic contact or ground wire. The ohmic contact on detection layer 12 is denominated 15. Each contact is attached to an appropriate lead wire.

Generally speaking the single element infrared detector of this invention comprises a substrate and a first epilayer of semiconducted materials which is denominated the lower or filter layer and a successive second epilayer denominated the detection layer of semiconductor materials. Each of these layers of semiconductor material is preferrably made of two or more adjacent contiguous sections made of separate and distinct and different semiconductor materials.

The substrate should be infrared transparent and compatible in crystal structure and lattice spacing to the two or more semiconductor materials set forth in more detail hereinafter making up the lower or filter layer and detection layer wherein each said layer is comprised of two or more separate distinct semiconductor materials.

Each of the semiconductor epilayers 11 and 12 should be made of materials that are infrared sensitive semiconductors with energy band gaps varying from approximately 0.1 point eV to and including 1.0 eV. In addition the materials to be used in each of these two epilayers should be similar in crystal structure having a variation in lattice spacing of 5% or less. The preferred materials for each of the two filter layers made up of two separate distinct materials 11A and 11B as well as the detection layer consisting of two separate and distinct materials 12A and 12B preferrable made up of lead chalcogenides abbreviated as PbS, PbSe, PbTe, lead sulfide, lead selenide and lead telluride or their alloys such as lead sulfide selenide, $PbS_xSE_{1-x}$, lead sulfide telluride, $PbS_yTe_{1-y}$, $PbSe_zTe_{1-y}$, and lead selenide telluride, $PbSe_zTe_{1-z}$, where the relative percentages x,y,z of the chalcogenide vary from 0 to 100%.

Suitable substrate 10 materials must be infrared transparent. Single crystals of alkali halides (e.g., KCl, NaCl, KBr) and alkali earth halides (e.g., $BaF_2, SrF_2$, $Ba_wSr_{1-w}F_2$ with $0<2<1$), have previously been found to be suitable. However, certain of the compounds (e.g., NaCl, KCl) are less preferred or even unsuitable because they are hygroscopic. In conclusion those substrate 10 materials which are suitable for use in the cited prior art infrared sensitive photodiodes are also suitable for the photodiodes of the present invention.

The epitaxial layer of semiconductor material 11A, 11B, 12A and 12B is produced by the vacuum deposition of a lead chalcogenide, lead tin chalcogenide, or lead cadmium chalcogenide onto the heated substrate 10. The chalcogenides used include sulfides, selenides, tellurides, and mixtures thereof. More specifically, some of the materials which may be used are represented by the following formulas PbS, PbTe, $PbS_xSe_{1-x}$, $PbSe_xTe_{1-x}$, $Pb_ySn_{1-y}S$, $PbySnl-ySe$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCD_{1-z}S$, $Pb_zCd_{1-z}Se$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$ and $0<z<1$, and preferrably $0.9<y<1$ and $0.8<z<1$.

Preferred among these materials are the lead chalcogenides:

PbS, PbSe, PbTe, $PBS_xSE_{1-x}$, and $PbSe_xTe_{1-x}$ wherein $0<x<1$.

The epitaxial layers 11 and 12 of semiconductor material 11A, 11B, 12A and 12B are grown on the substrate by conventional vacuum deposition techniques. Examples of these techniques are disclosed in U.S. Pat. No. 3,716,424, entitled "Method of Preparation of Lead Sulfide PN Junction Diodes", which was issued to Richard B. Schoolar.

The epilayers (thin single crystalline layers) may be deposited by MBE (molecular beam epitaxy) or vapor deposition techniques, as well known in the art.

In addition to the above materials are the preferred potential materials are as follows PbS, PbSe, PbTe, $PbS_xSE_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}Sn_{12-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zTe$, $Pb_zCd_{1-z}Cd_{1-z}Se_{1-x}$, $Pb_zCd_{1-z}S_xTe_{1-x}$, and $Pb_zCD_{1-z}SeTe_{1-x}$, wherein $0<x<1$, $0<z<1$ and $0<z<1$, and preferrably $0.9<y<1$ and $0.8<z<1$.

Figure 2:
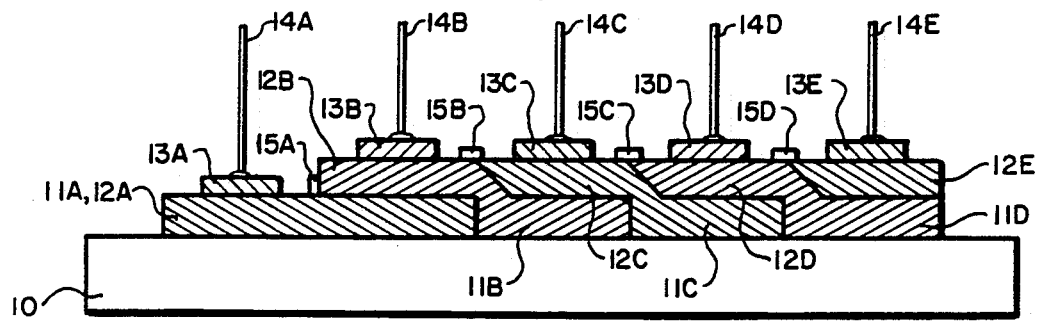
FIG. 2 is a cross sectional view of a multi-layer single element detector wherein the filter layer is made of the lower portions of four separate and distinct semiconductor material layers and the upper detection layer is made of the upper portions of five separate and distinct material layers.

In FIG. 2 the cross sectional view of a multi-layer single element infrared detector is illustrated. The substrate 10 is in the same position as in FIG. 1. Coated on substrate 10 is the lower semiconductor or the filter layer consisting of 4 adjacent contiguous separate and distinct photo-sensitive materials denominated 11A, 11B, 11C and 11D each of these materials is deposited by a conventional vacuum deposition technique well known in the art. For example 11A may comprise and consist of PbS, 11B may comprise and consist of $PbS_{0.5}Se_{0.5}$, 11C may consist of $PbS_{0.3}Se_{0.7}$, 11D may consist of PbSe and 11e may consist of $Pb_{0.95}Sn_{0.05}Se$. In a unique and unusual geometric configuration semiconductor layer 11B may be vacuum deposited on the substrate and at the same time may coat on top of the filter layer 11A to form detection layer 12B Likewise when filter layer 11C is vacuum deposited from $PbS_{0.5}Se_{0.5}$ detection layer 12C may be formed at the same time by coating directly on top of 11B. In the configuration, the left-most filter layer 11A serves also as an detection layer 12A, and the right-most layer 12E is used as an detection layer only. The upper layer is active as photon detector and is coated with non-ohmic contacts 13A, 13B, 13C, 13D and 13E as illustrated. These contacts are usually made of lead or indium or their compounds and each is fitted with a lead wire 14A, 14B, 14C, 14D and 14E. As has been previously indicated only the upper surface is exposed and it is for this reason that on the upper surface the non-ohmic contact is formed and is coated with an non-ohmic contact. Ohmic contacts 15A, 15B, 15C and 15D are illustrated in FIG. 2. Each ohmic contact amounts to no more than a ground wire, and various ground wire ohmic contacts may be deposited on the detection layer surface as being well known within the state of the art.

Figure 3:
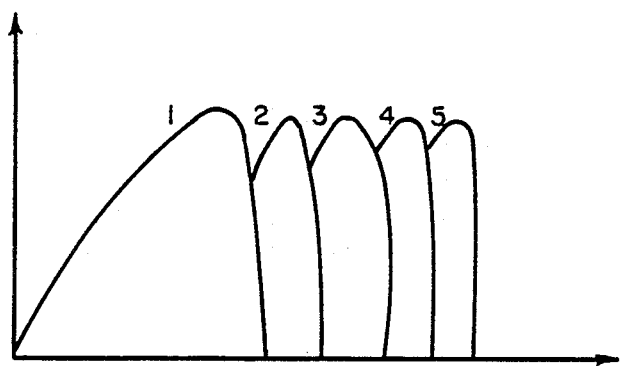
FIG. 3 is a graph showing the relative spectral response according to the photo response of the multi-layer device of FIG. 2.

FIG. 3 illustrates relative optical response indicated along the y-axis and the wavelength of the infrared radiation along the x-axis. The points 1, 2, 3, 4, and 5 identify the optical response that is extracted from the detection upper layers 12A, 12B, 12C, 12D and 12E by means of the non-ohmic contacts 13A, 13B, 13C, 13D and 13E. In FIG. 3 the first and left most semiconductor coating 12A will therefore respond to radiation of wavelength between 0 and 3 microns when measurement of optical responsivity is conducted, while only layer contact 12B will give a spectral response in a range of 3 to 3.4 microns. The total waveband width for the entire device runs from 0 to 5 microns.

Figure 4:
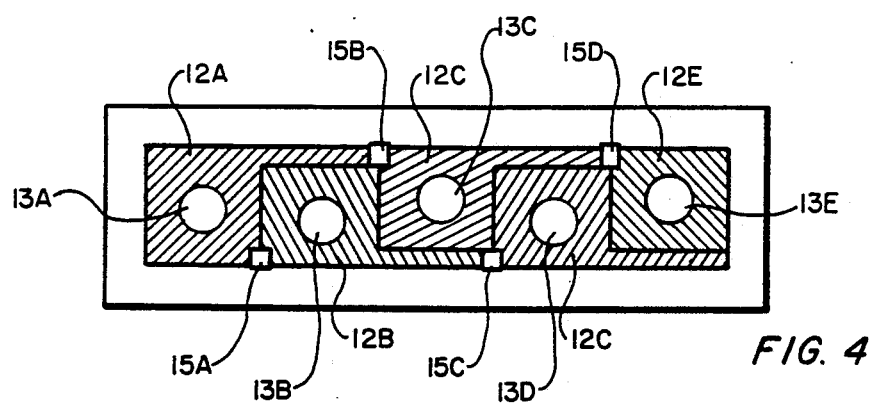
FIG. 4 is a plane view of an elongated multiple layer detector made of five separate and distinct materials wherein the detection layer consists of the upper portions of five distinct materials each coated with a non-ohmic and an ohmic contact.

In another configuration an alternate embodiment shown in FIG. 4 a substrate comprising barium fluoride is coated with lead sulfide. The lower portion of the lead sulfide layer is contiguous to and adjacent to a different material $PbS_{0.5}Se_{0.5}$ indicated at 2. Each of the non-ohmic contacts is indicated as 13A, 13B, 13C, 13D and 13E respectively and each optical area designated as 12A, 12B, 12C, 12D and 12E respectively is grounded by ohmic contacts indicated as 15A, 15B, 15C and 15D.

Figure 5:
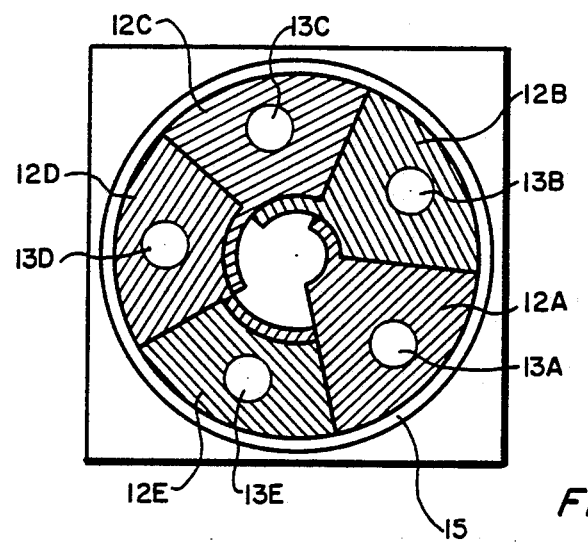
FIG. 5 is a plane view of an alternative embodiment wherein the top layer of the detector consists of an arc of a circle.

In an alternative embodiment shown in FIG. 5 the ohmic contact 15 is circular in shape and surrounds five different semiconductor materials each a pie shaped segment; on the upper surface of each pie shaped segment the optical area is coated with a non-ohmic contact 13A, 13B, 13C, 13D and 13E respectively. Each of these contacts is connected by a conventional lead wire to a voltage measuring device whereby when radiation is transmitted through each of the separate and distinct semiconductor materials a voltage reading may be obtained indicating charge concentration on each separate and distinct non-ohmic contacts In FIG. 5 a rectangular barium fluoride substrate is illustrared and disclosed in this figure a circular detector having an ohmic contact running around the entire periphery circumference of each of the five different optical areas of the detection layer indicated as 12A, 12B, 12C, 12D and 12E is disclosed. Non-ohmic contacts are circular in shape made from a deposit of lead or indium and are indicated as 13A, 13B, 13C and 13E.

Figure 6:
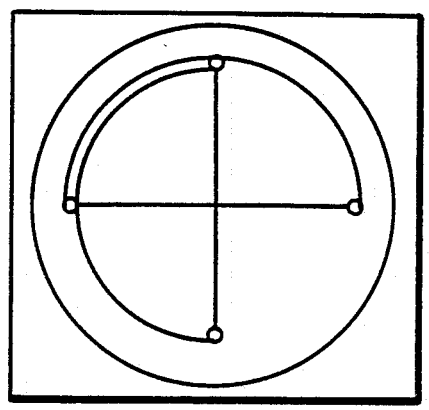
FIG. 6 is a plane or top view of a detector having three distinct materials in the detection layer.

In FIG. 6 another embodiment of the invention is disclosed in this case a rectangular barium fluoride substrate is coated with a first layer made up of lead sulfide applied in a circular configuration. Onto this layer is coated two distinct 180° semicircles the first semicircle is $Pb_{0.5}S Se_{0.5}$ the second semicircle is PbSe.

Figure 7:
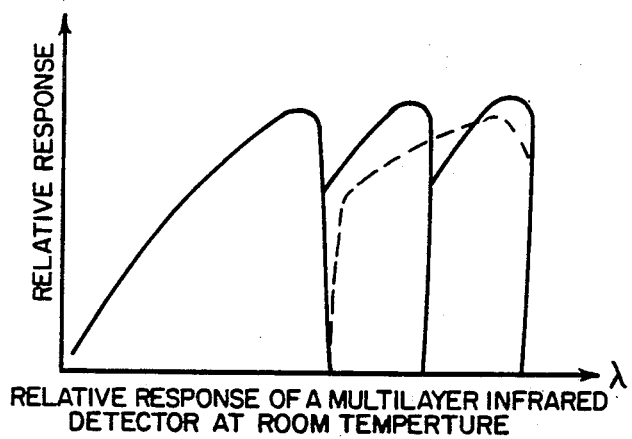
FIG. 7 is a graph illustrating relative absorption of the device in FIG. 6 on the y axis and wavelengths of radiation on the x axis.

FIG. 7 is a graphic illustration of the multilayer detector shown in FIG. 6 wherein relative response is given along the y-axis and wavelength in microns is given on the x axis.

Figure 8:
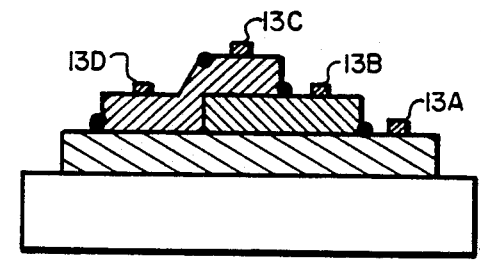
FIG. 8 is a cross section of an infrared detector illustrating an alternative embodiment having three semiconductor layers.

In FIG. 8 a three layer detector is illustrated in a cross sectional view. A barium fluoride substrate is first provided. A layer of lead sulfide, PbS, is coated directly on the substrate. A secondary layer of $Pb_{0.5}SSe_{0.5}$ is next coated on the lead sulfide and covers only partially the area of the lead sulfide. Next a lead selenide layer is provided directly on the first lead sulfide layer and laps over to cover part of the lead selenide second level layer so that the lead selenide layer on the top forms a third level layer coating. Each of the top layers is then coated with a non-ohmic contact 13A, 13B, 13C and 13D and ohmic or ground wire connection is made at each junction of the lower and secondary level of layers and in the junction between each second and third level layer of semiconductor material.

Figure 9:
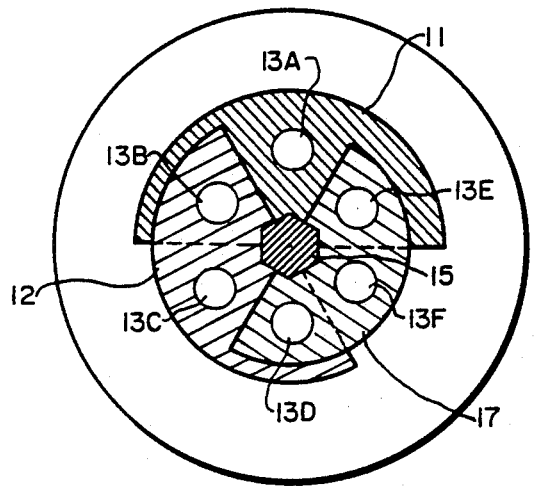
FIG. 9 is a plane view of an alternative embodiment wherein each succeeding semiconductor layer is semicircular in shape and offset with regard to the previous layer.

FIG. 9 illustrates still another further alternative embodiment. The first layer 11 consists essentially of lead sulfide coated on the substrate in a semicircular shape. A secondary semicircular 12 layer that is set off at 60° with regard to the first layer comprising lead sulfide selenide is next coated on by conventional vacuum deposition techniques. A third level layer and in this case a third coating of lead selenide set at 60° angle to the two lower level coatings is coated on. One single ohmic contact 15 is provided at the center of the semicircular stack of coatings and is in contact with each of the three layers. Contacts 13A, 13B, 13C, 13D, 13E and 13F are provided on each top optical surface and provide six optically active areas, each area provides a separate and distinct spectral response in terms of wavelength and band width.

Figure 10:
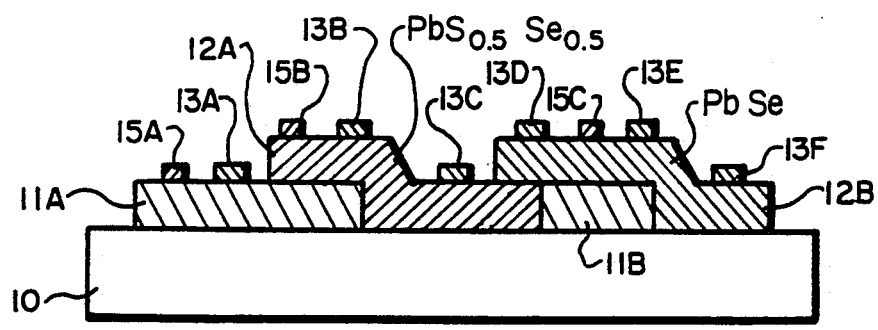
FIG. 10 is a cross section of an alternative embodiment of the invention comprising two separate and distinct layers of semiconductor materials.

In a still further embodiment an alternative elongated radiation detector illustrated in FIG. 10 a barium fluoride substrate 10 is coated with a first partial coating covering only part of the area of the barium fluoride consisting of lead sulfide PbS, 11A. A first level coating of PbS, denominated 11C is coated simultaneously with layer 11A on a different area of the substrate 10. Another coating consisting of $Pbs_{0.5}Se_{0.5}$, the lower portion which is designated 11B is coated over only part of the substrate; and, the upper portion of which is designated 12A, also cover part only of the lead sulfide 11A. A third material being indicated in the drawing as lead selenide PbSe the lower portion of which, designated 11C, is coated on the substrate covering only a narrow area of the barium fluoride substrate and is also coated over the Pbs coating 11A to form a upper portion 12B. Each indicated is coated with a non-ohmic contact being indicated as 13A, 13B, 13C, 13D, 13E and 13F. Ohmic contacts 15A, 15B and 15C form a ground at the junction point of each first and second layer each lower layer with each upper layer.

Figure 11:
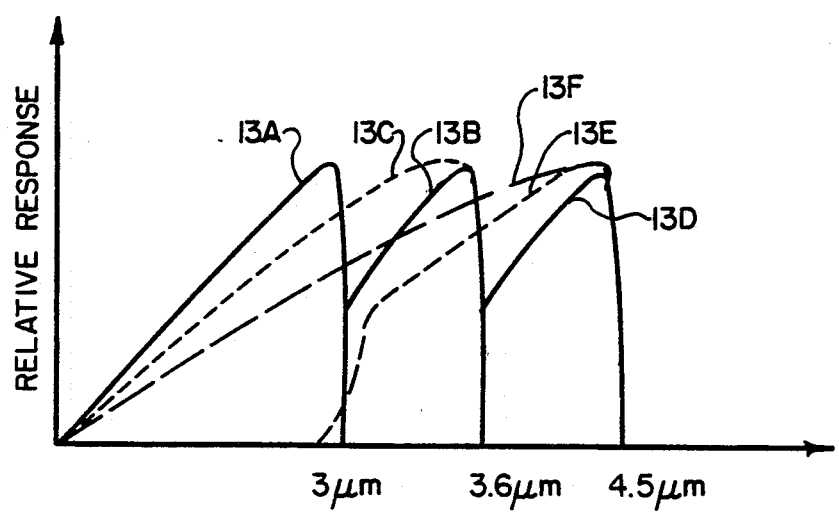
FIG. 11 is a graphic illustration of the detector illustrated in FIG. 10 plotting relative response on the y axis and wavelength of radiation on the x axis.

FIG. 11 is a graphic illustration of relative photoresponse along the y-axis, versus wavelength along the x-axis in microns varying from 0 to 4.5 microns for the detector configurations of FIG. 9 and FIG. 10. Each of curves labelled by a numeral represents the spectral response of the areas labelled by the same numeral in FIG. 9 and FIG. 10.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An infrared detector comprising:
   an infrared light transpartent substrate;
   a plurality of successively adjacent optically responsive infrared semiconductor materials deposited on the substrate; with means to selectively transmit radiation and where each successive infrared semiconductor material is adapted to absorb different wave lengths of infrared light; each infrared semiconductor material forming a layer being a single uniform chemical composition and a comprising a lower filter portion and an upper detector portion; said lower portion deposited directly on the substrate with said upper portion overlying the lower portion of an adjacent infrared semiconductor material layer; whereby infrared light may pass through the substrate without absorption, in the infrared semiconductor material defining the lower portion be absorbed in respective frequency ranges, and transmitted to the upper portion of the following adjacent infrared semiconductor material layer for causing an electrical signal to be generate therein as an optical response; and ohmic and non-ohmic contacts on each upper portion of a layer whereby the magnitude of the electrical signal between said ohmic and non-ohmic contacts is responsive to the magnitude of the infrared light of frequencies in the range not absorbed in the lower portion of the previous adjacent infrared semiconductor material layer and hence transmitted to the upper portion of the optically responsive infrared semiconductor material layer;
   provided that the cutoff wavelength of the following infrared semiconductor layer is longer than the cutoff wavelength of the previous infrared semiconductor material layer.

2. The infrared detector of claim 1 where the selective transmission of radiation to the infrared semiconductor material layers is facilitated by a filter layer covering the portion of the substrate where in infrared semiconductor material layers are deposited.

3. Detector of claim 1 wherein the infrared semiconductor material layers are each in the shape of a segment of a circle and are aligned such that the entire multiple layer structure forms a complete circle and that each infrared semiconductor material layer segment covers part of the substrate, and also a partial area of a second infrared semiconductor material layer segment, and that a partial area of the remaining area of the second infrared semiconductor material layer segment is in turn covered by a third infrared semiconductor material layer segment;
   wherein an ohmic and a nonohmic contact are placed on each portion of the upper surface of a given infrared semiconductor material layer which covers another infrared semiconductor material layer or covers the transparent substrate to provide the unique electrical signal therefrom.

* * * * *